US011429317B2

(12) United States Patent
Xiao et al.

(10) Patent No.: US 11,429,317 B2
(45) Date of Patent: Aug. 30, 2022

(54) METHOD, APPARATUS AND COMPUTER PROGRAM PRODUCT FOR STORING DATA

(71) Applicant: EMC IP Holding Company LLC, Hopkinton, MA (US)

(72) Inventors: Pan Xiao, Chengdu (CN); Peilei Chen, Chengdu (CN); Fang Du, Guangyuan (CN); Xu Chen, Chengdu (CN)

(73) Assignee: EMC IP Holding Company LLC, Hopkinton, MA (US)

(*) Notice: Subject to any disclaimer, the term of this patent is extended or adjusted under 35 U.S.C. 154(b) by 257 days.

(21) Appl. No.: 16/576,980

(22) Filed: Sep. 20, 2019

(65) Prior Publication Data

US 2020/0133583 A1 Apr. 30, 2020

(30) Foreign Application Priority Data

Oct. 26, 2018 (CN) .......................... 201811261855.4

(51) Int. Cl.
G06F 3/00 (2006.01)
G06F 3/06 (2006.01)
G06N 20/00 (2019.01)
G06N 5/04 (2006.01)
H03M 7/30 (2006.01)

(52) U.S. Cl.
CPC ............ *G06F 3/0661* (2013.01); *G06F 3/064* (2013.01); *G06F 3/0608* (2013.01); *G06F 3/0673* (2013.01); *G06N 5/04* (2013.01); *G06N 20/00* (2019.01); *H03M 7/30* (2013.01)

(58) Field of Classification Search
CPC ............. G06F 2212/401; G06F 3/0661; G06F 3/0608; G06F 3/064; H03M 7/30; G06N 20/00; G06N 5/04
See application file for complete search history.

(56) References Cited

U.S. PATENT DOCUMENTS

| 7,898,442 | B1* | 3/2011 | Sovik .................. H03M 7/3088 341/51 |
| 8,478,731 | B1 | 7/2013 | Throop et al. |
| 9,460,389 | B1 | 10/2016 | Botelho et al. |
| 9,564,918 | B2* | 2/2017 | Asher ................. H03M 7/6088 |
| 9,858,311 | B2 | 1/2018 | Bordignon et al. |
| 9,935,652 | B1 | 4/2018 | Chalmer et al. |
| 10,013,200 | B1 | 7/2018 | Shveidel et al. |
| 10,153,779 | B1 | 12/2018 | Bordignon et al. |
| 10,467,102 | B1 | 11/2019 | Baruch et al. |
| 10,694,002 | B1 | 6/2020 | Savir et al. |
| 10,715,176 | B1 | 7/2020 | Singh et al. |
| 10,970,221 | B2 | 4/2021 | Armangau et al. |
| 11,048,419 | B2 | 6/2021 | Armangau et al. |

* cited by examiner

Primary Examiner — Reginald G Bragdon
Assistant Examiner — Michael L Westbrook
(74) Attorney, Agent, or Firm — BainwoodHuang

(57) ABSTRACT

Techniques involve storing data. In particular, such techniques involve: obtaining first data to be stored; determining whether the first data is able to be compressed in a compression ratio exceeding a predetermined threshold; and storing, based on the determined result, the first data into a storage device. Accordingly, such techniques can execute corresponding processing for data in a predicted compression ratio, so as to store the data into a storage device. In this manner, such techniques can significantly cut down the overheads for processing data while minimizing a storage space required for storing data.

9 Claims, 10 Drawing Sheets

METHOD, APPARATUS AND COMPUTER PROGRAM PRODUCT FOR STORING DATA

CROSS-REFERENCE TO RELATED APPLICATION

This application claims priority to Chinese Patent Application No. CN201811261855.4, on file at the China National Intellectual Property Administration (CNIPA), having a filing date of Oct. 26, 2018, and having "METHOD, APPARATUS AND COMPUTER PROGRAM PRODUCT FOR STORING DATA" as a title, the contents and teachings of which are herein incorporated by reference in their entirety.

FIELD

Embodiments of the present disclosure generally relate to the field of data storage, and more specifically, to a method, an apparatus and a computer program product for storing data.

BACKGROUND

A modern storage system may compress data prior to storing the same to a storage device, so as to save storage space required. When reading data stored in a compression manner, it is first required to execute a decompression operation on the data to obtain the original data.

However, for different data, a compression ratio (i.e., a ratio value of the amount of data before compression to the amount of data after compression) can be achieved is varied. For example, for the original data that have been compressed, the compression ratio for recompressing the same may be quite low. For such data, execution of a compression operation prior to storage would not bring about a noticeable saving in the storage space, and thus the processing overheads caused by the compression and decompression operations may be necessary.

SUMMARY

Embodiments of the present disclosure provide a method, an apparatus, and a computer program product for storing data.

In a first aspect of the present disclosure, there is provided a method of storing data. The method includes: obtaining first data to be stored; determining whether the first data is able to be compressed in a compression ratio exceeding a predetermined threshold; and storing, based on the determined result, the first data into a storage device.

In a second aspect of the present disclosure, there is provided a method of training a prediction model. The method includes: obtaining a training dataset for training a prediction model; and training the prediction model using the training dataset, wherein the prediction model is provided for determining whether data to be stored is able to be compressed in a compression ratio exceeding the predetermined threshold, to store the data to be stored based on the determined result.

In a third aspect of the present disclosure, there is provided an apparatus for storing data. The apparatus includes at least one processing unit and at least one memory. The at least one memory is coupled to the at least one processing unit and stores instructions executed by the at least one processing unit. The instructions, when executed by the at least one processing unit, cause the apparatus to execute acts of: obtaining first data to be stored; determining whether the first data is able to be compressed in a compression ratio exceeding a predetermined threshold; and storing, based on the determined result, the first data into a storage device.

In a fourth aspect of the present disclosure, there is an apparatus for training a prediction model. The apparatus includes at least one processing unit and at least one memory. The at least one memory is coupled to the at least one processing unit and stores instructions executed by the at least one processing unit. The instructions, when executed by the at least one processing unit, cause the apparatus to execute acts of: obtaining a training dataset for training a prediction model; and training the prediction model using the training dataset, wherein the prediction model is provided for determining whether data to be stored is able to be compressed in a compression ratio exceeding the predetermined threshold, to store the data to be stored based on the determined result.

In a fifth aspect of the present disclosure, there is provided a computer program product. The computer program product is tangibly stored in a non-transient computer storage medium and includes machine executable instructions. The machine executable instructions, when executed by a device, cause the device to execute any step of the method as described in the first aspect of the present disclosure.

In a sixth aspect of the present disclosure, there is provided a computer program product. The computer program product is tangibly stored in a non-transient computer storage medium and includes machine executable instructions. The machine executable instructions, when executed by a device, cause the device to execute any step of the method as described in the second aspect of the present disclosure.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The above and other objectives, features and advantages of the present disclosure will become more apparent, through the following detailed description of the example embodiments of the present disclosure with reference to the accompanying drawings, in which the same reference signs generally refer to the same elements.

Throughout the drawings, the same or similar reference symbols refer to the same or similar elements.

DETAILED DESCRIPTION OF EMBODIMENTS

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Preferred embodiments of the present disclosure will now be described in detail with reference to the accompanying drawings. Although the drawings illustrate preferred embodiments of the present disclosure, it would be appreciated that the present disclosure may be implemented in various manners but cannot be construed as being limited by the embodiments illustrated herein. Rather, these embodiments are provided to disclose the present disclosure more thoroughly and completely, and to convey the scope of the present disclosure fully to those skilled in the art.

As used herein, the term "includes" and its variants are to be read as open-ended terms that mean "includes, but is not limited to." The term "or" is to be read as "and/or" unless the context clearly indicates otherwise. The term "based on" is to be read as "based at least in part on." The term "an example embodiment" and "an embodiment" are to be read as "at least one example embodiment." The term "another embodiment" is to be read as "at least another embodiment." The terms "first," "second," and the like may refer to different or the same objects. Other definitions, either explicit or implicit, may be included below.

Figure 1:
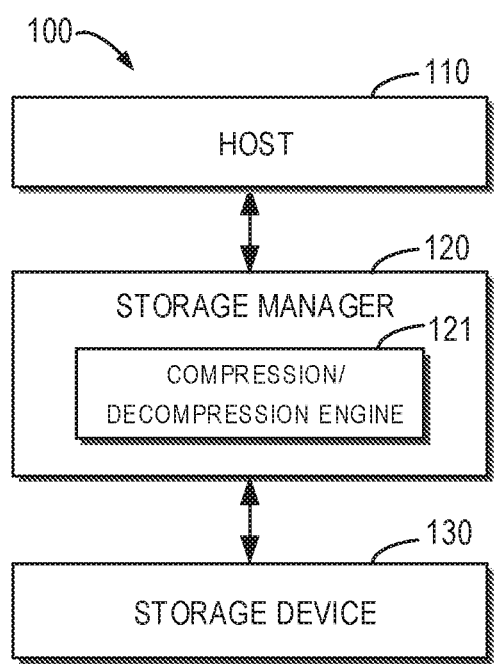
FIG. 1 illustrates a schematic diagram of an example environment in which embodiments of the present disclosure may be implemented.

FIG. 1 illustrates a block diagram of an example environment 100 in which embodiments of the present disclosure may be implemented. As shown in FIG. 1, the environment 100 includes a host 110, a storage manager 120 and a storage device 130. It would be appreciated that the structure of the environment 100 is described merely for illustrative purpose, without implying any limitation to the scope of the present disclosure. For example, the embodiments of the present disclosure may also be applied to a different environment than the environment 100.

The host 110 may be, for example, any physical computer, virtual machine, server and the like for running a user application. The host 110 may transmit an input/output (I/O) request to the storage manager 120 which is provided, for example, for reading data from the storage device 130 and/or writing data to the storage device 130. In response to receiving a read request from the host 110, the storage manager 120 may read data from the storage device 130, and return the read data to the host 110. In response to receiving a write request from the host 110, the storage manager 120 may write data to the storage device 130. The storage device 130 may be any non-volatile storage medium currently known or to be developed in the future, such as a magnetic disk, a Solid State Disk (SSD), an array of disks or the like.

In order to save the space required for data storage, a compression/decompression engine 121 (not shown) may be deployed in the storage manager 120. For example, when receiving, from the host 110, a write request for writing data to the storage device 130, the storage manager 120 may compress data to be stored using the compression/decompression engine 121, and then store the compressed data in the storage device 130. As such, when reading data stored in a compression manner, the storage manager 120 is required to first decompress the read data using the compression/decompression engine 121, and then return the decompressed data to the host 110.

As described above, the compression ratio (i.e., the ratio of the amount of data before compression to the amount of data after compression) can be achieved with different data is varied. For example, for data that have been compressed, the compression ratio for recompressing the same may be quite low. For such data, execution of a compression operation prior to storage would not bring about a noticeable saving in the storage space, but instead introduce extra processing overheads caused by the compression and decompression operation.

The embodiments of the present disclosure provide a solution for storing data, so as to solve the problem described above and one or more of other potential problems. The solution may execute corresponding processing for data based on a predicted data compression ratio, so as to store data in a storage device. In this way, the solution can significantly cut down the overheads for processing data while minimizing a storage space required for storing data.

Figure 2:
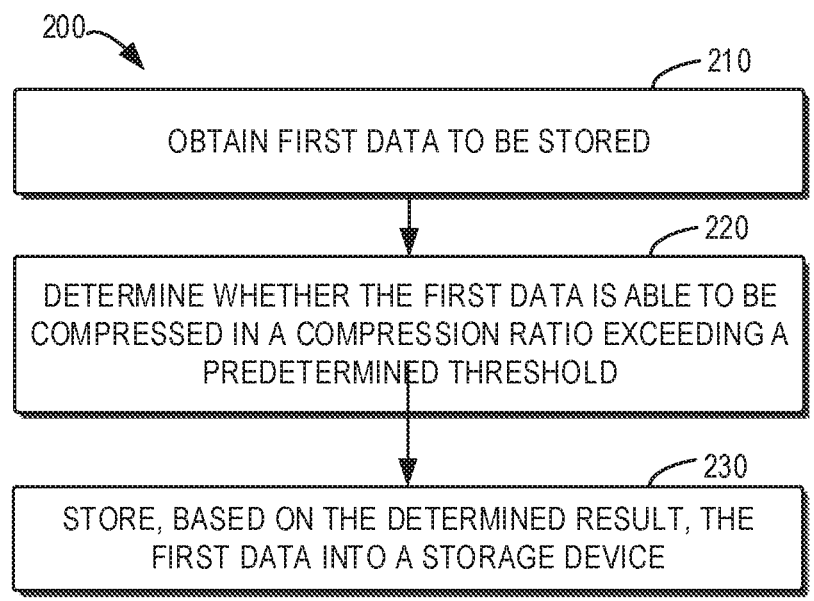
FIG. 2 illustrates a flowchart of an example method for storing data according to embodiments of the present disclosure.

FIG. 2 illustrates schematically a flowchart of an example method 200 for storing data according to embodiments of the present disclosure. For example, the method 200 may be executed by a storage manager 120 as shown in FIG. 1. It would be appreciated that the method 200 may further include additional acts not shown and/or skip acts as shown, and the scope of the present disclosure is not limited in the aspect. The method 200 will be described below in detail with reference to FIG. 1.

At block 210, the storage manager 120 may obtain data to be stored (also referred to as "first data" herein).

In some embodiments, in response to receiving, from the host 110, a request for writing data into the storage device 130, the storage manager 120 may obtain, from the request, data to be written (also referred to as "second data" herein). In some embodiments, the storage manager 120 may partition the second data into a group of data blocks, each of which may have a predetermined size (for example, 8 KB). Then, the storage manager 120 may obtain, from the group of data blocks, a plurality of consecutive data blocks as first data. In some embodiments, for example, the storage manager 120 may obtain 16 consecutive data blocks (i.e., 128 KB) each time for processing. It would be appreciated that the above specific numbers are given merely for illustration, without implying any limitation to the scope of the present disclosure.

At block 220, the storage manager 120 may determine whether the first data is able to be compressed in a compression ratio exceeding a predetermined threshold. The "compression ratio" herein may refer to a ratio value of the amount of data before compression to the amount of data after compression. For example, the predetermined threshold may be 5.

In some embodiments, the storage manager 120 may predict, using a trained prediction model, whether the first data is able to be compressed in a compression ratio exceeding the predetermined threshold. For example, the prediction model may receive a plurality of consecutive data blocks included in the first data as an input, and output a corresponding prediction result. In some cases, depending on specific training manners of the prediction model, the prediction model may also receive a feature vector that represents the plurality of consecutive data blocks (extraction of the feature vector here is similar to extraction of a feature vector in a training procedure, as will be described below with reference to FIG. 9), and output a corresponding output result. Herein, data capable of being compressed in a compression ratio exceeding the predetermined threshold may be considered as "compressible," while data not capable of being compressed in a compression ratio exceeding the predetermined threshold (for example, data that have been compressed) may be considered as "incompressible."

According to different training manners, the output of the prediction model may be in different forms. In some embodiments, the prediction model may receive a plurality of consecutive data blocks and output a prediction result in a first form. For example, the prediction result may be one of the following: a first value that indicates that each data block of the plurality of consecutive data blocks is able to be compressed in a compression ratio exceeding the predetermined threshold; a second value that indicates that each data block of the plurality of consecutive data blocks is unable to be compressed in a compression ratio exceeding the predetermined threshold; or a third value that indicates that a part of the plurality of consecutive data blocks is able to be compressed in a compression ratio exceeding the predetermined threshold, while the other part of the plurality of consecutive data blocks is unable to be compressed in a compression ratio exceeding the predetermined threshold. Alternatively, in some other embodiments, the prediction model may receive a plurality of consecutive data blocks and output a prediction result in a second form. For example, the result may indicate that several consecutive data blocks starting from the first data block is able to be compressed in a compression ratio exceeding the predetermined threshold, or several consecutive data blocks starting from the first data block is unable to be compressed in a compression ratio exceeding the predetermined threshold.

It can be seen that the prediction result in the first form is a simplified version of the prediction result in the second form. In the context, for the purpose of illustration and simplification, the prediction result in the first form is taken as an example for discussing the embodiments of the present disclosure in detail. However, it would be appreciated that this does not imply any limitation to the scope of the present disclosure. The embodiments of the present disclosure are also applicable to the prediction result in the second form. Training of the prediction model will be discussed in detail hereinafter.

At block 230, the storage manager 120 may store the first data in the storage device 130, based on the determined result.

Figure 3:
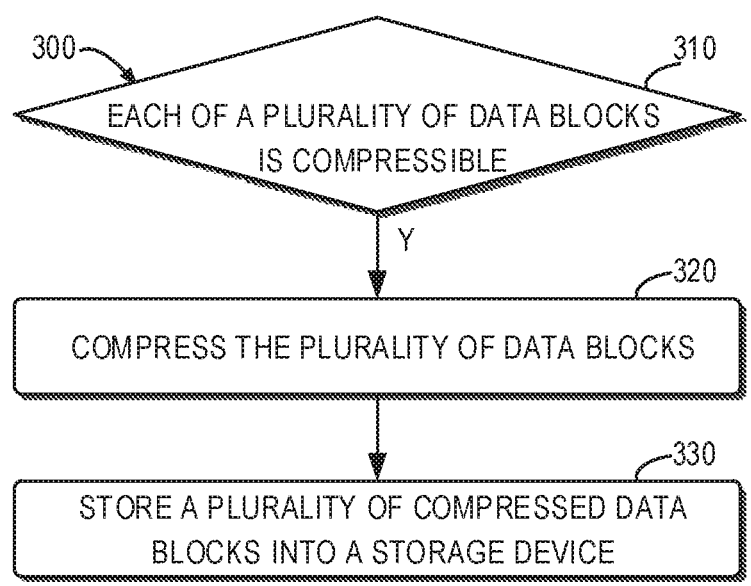
FIG. 3 illustrates a flowchart of an example method of storing data according to embodiments of the present disclosure.

FIG. 3 illustrates a flowchart of an example method 300 for storing data according to embodiments of the present disclosure. The method 300 may be an example implementation of the block 230 as shown in FIG. 2. As shown in FIG. 3, at block 310, the storage manager 120 may determine whether each of a plurality of data blocks included in the first data is able to be compressed in a compression ratio exceeding the predetermined threshold. For example, the storage manager 120 may determine whether the prediction model inputs the first value described above as the result. If so, at block 320, the storage manager 120 may compress, using the compression/decompression engine 121, the plurality of data blocks as a whole. Then, at block 330, the storage manager 120 may store the plurality of compressed data blocks into the storage device 130.

Figure 4:
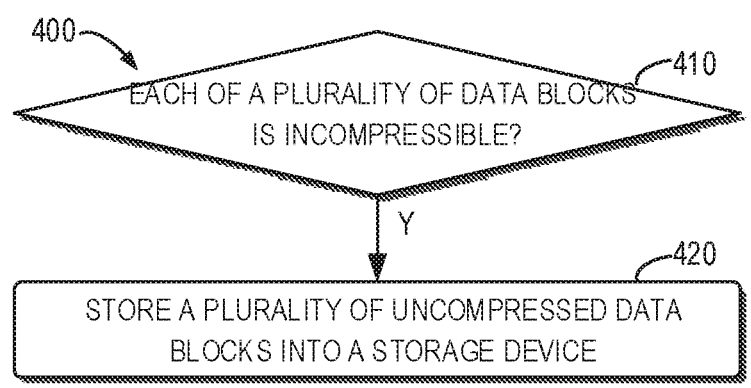
FIG. 4 illustrates a flowchart of an example method of storing data according to embodiments of the present disclosure.

FIG. 4 illustrates a flowchart of an example method 400 for storing data according to embodiments of the present disclosure. The method 400 may be an example implementation of the block 230 as shown in FIG. 2. As shown in FIG. 4, at block 410, the storage manager 120 may determine whether each of a plurality of data blocks in the first data is unable to be compressed in a compression ratio exceeding the predetermined threshold. That is, the storage manager 120 may determine whether the output of the prediction model is the second value as described above. If so, at block 420, the storage manager 120 may store the plurality of uncompressed data blocks directly into the storage device 130.

Figure 5:
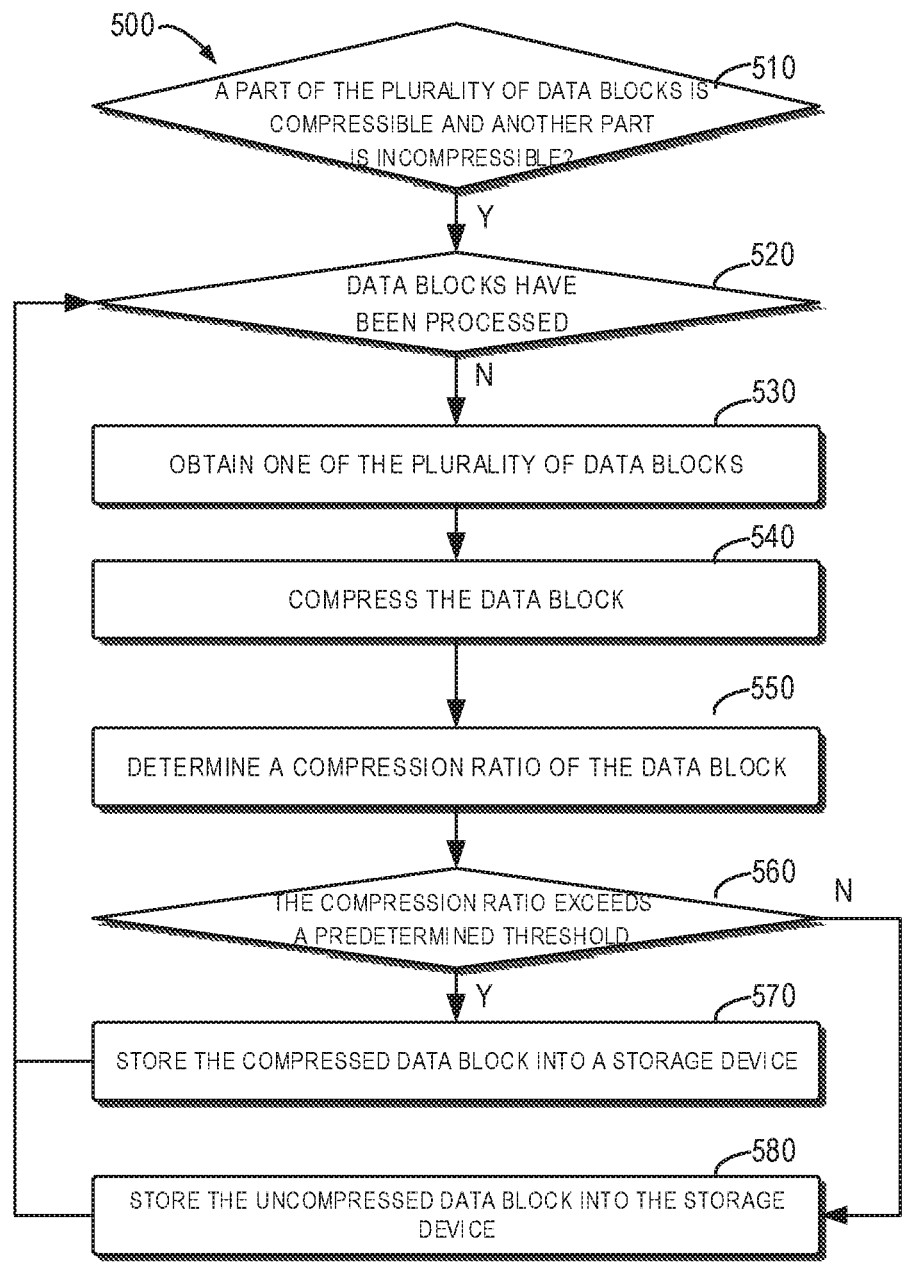
FIG. 5 illustrates a flowchart of an example method for storing data according to embodiments of the present disclosure.

FIG. 5 illustrates a flowchart of an example method 500 for storing data according to embodiments of the present disclosure. The method 500 may be an example implementation of the block 230 as shown in FIG. 2. As shown in FIG. 5, at block 510, the storage manager 120 may determine whether a plurality of data blocks included in the first data are partially compressible and partially incompressible. That is, the storage manager 120 may determine whether the output of the prediction model is the third value as described above. If so, at block 520, the storage manager 120 may determine whether the plurality of data blocks have been processed. If there are still unprocessed data blocks, at block 530, the storage manager 120 may obtain one of the plurality of data blocks for processing. At block 540, the storage manager 120 may compress the data block using the compression/decompression engine 121. At block 550, the storage manager 120 may determine the compression ratio of the data block. For example, the storage manager 120 may determine the compression ratio by calculating a ratio value of the amount of data before compression to the amount of data after compression. Then, at block 560, the storage manager 120 may determine whether the compression ratio exceeds the predetermined threshold. If so, at block 570, the storage manager 120 may store the compressed data blocks into the storage device 130; otherwise, at block 580, the storage manager 120 may store the uncompressed data blocks into the storage device 130. Thereafter, the method 500 proceeds to block 520 until all of the plurality of data blocks are processed.

In some embodiments, as described above, the result determined at block 220 may be in the second form, which indicates, for example, that several consecutive data blocks starting from the first data block of the plurality of data blocks included in the first data may be compressed in a compression ratio exceeding the predetermined threshold, or indicates that several consecutive data blocks starting from the first data block is unable to be compressed in a compression ratio exceeding the predetermined threshold. In some embodiments, if the result indicates that several consecutive data blocks starting from the first data block of the plurality of data blocks included in the first data are compressible, the storage manager 120 may compress, using the compression/decompression engine 121, these compressible consecutive data blocks as a whole, and store the compressed data blocks into the storage device 130. For the remaining data blocks of the plurality of data blocks, the storage manager 120 may process the remaining data blocks by executing the method 500. Alternatively, in some embodiments, if the result indicates that several consecutive data blocks starting from the first data block of the plurality of data blocks included in the first data are incompressible, the storage manager 120 may store directly these incompressible consecutive data blocks into the store device 130. For the remaining data blocks of the plurality of data blocks, the storage manager 120 may process the remaining data blocks by executing the method 500.

In the way, for data with a compression ratio not meeting the requirement, the storage manager 120 may store them directly into the storage device without compression, thereby significantly reducing overheads for executing compression and decompression operations for these data.

Figure 6:
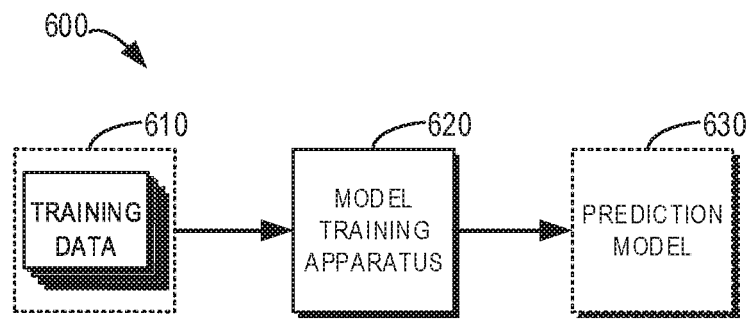
FIG. 6 illustrates a block diagram of a model training system according to embodiments of the present disclosure.

Training of a prediction model will be further discussed below in detail with reference to drawings. FIG. 6 illustrates a block diagram of a model training system 600 according to embodiments of the present disclosure. As shown in FIG. 6, the system 600 may include a model training apparatus 620 which is configured to obtain a training dataset 610 and train a prediction model 630 by using the training dataset 610. For example, the prediction model 630 may be used by the storage manager 120 as shown in FIG. 1 for determining whether data to be stored is able to be compressed in a compression ratio exceeding the predetermined threshold.

In some embodiments, the model training apparatus 620 may be implemented, together with the storage manager 120 as shown in FIG. 1, on the same physical device. Alternatively, in some other embodiments, the model training apparatus 620 and the storage manager 120 as shown in FIG. 1 may be implemented on different physical devices, respectively. For example, when the model training apparatus 620 and the storage manager 120 as shown in FIG. 1 are implemented on the same physical device, the model training procedure may be executed in the background or when the system is not busy, in order to not impact the storage management performance.

Figure 7:
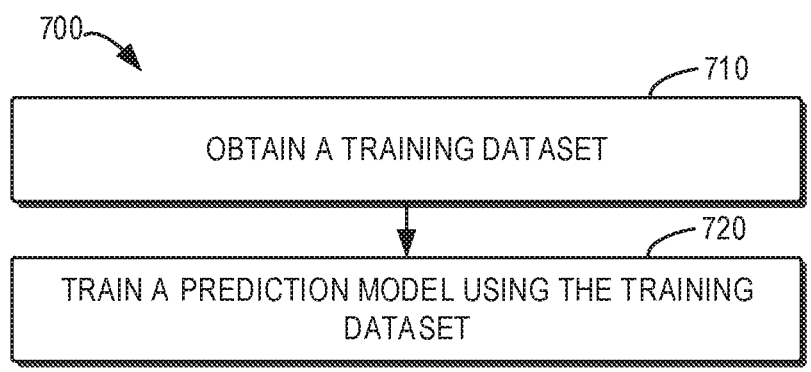
FIG. 7 illustrates a flowchart of an example method of training a prediction model according to embodiments of the present disclosure.

FIG. 7 illustrates a flowchart of a method 700 for training a prediction model according to embodiments of the present disclosure. For example, the method 700 may be executed by the model training apparatus 600 as shown in FIG. 6. It would be appreciated that the method 700 may further include additional acts not shown and/or skip acts as shown, and the scope of the present disclosure is not limited in the aspect. The method 700 will be described below in detail with reference to FIG. 6.

Figure 8:
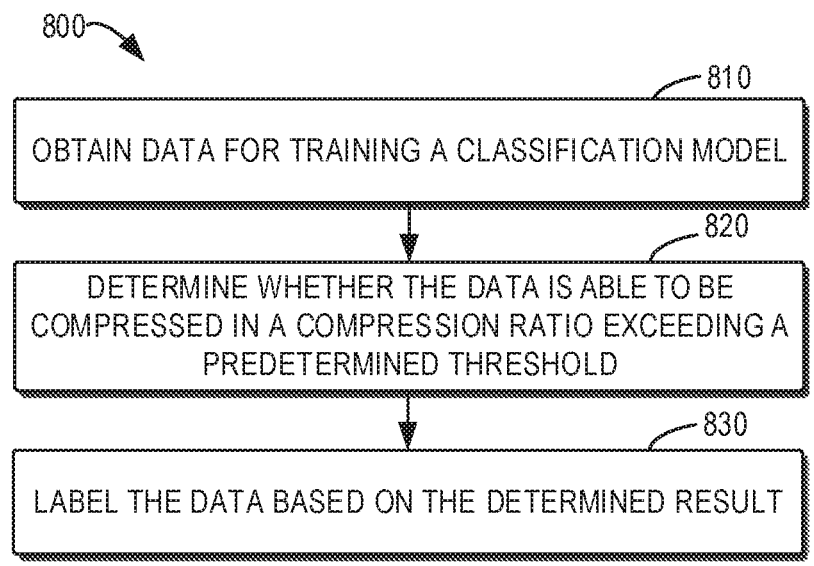
FIG. 8 illustrates a flowchart of an example method of obtaining training data according to embodiments of the present disclosure.

At block 710, the model training apparatus 600 may obtain the training dataset 610. For example, the training dataset 610 may be comprised of a set of training data. FIG. 8 illustrates a flowchart of a method 800 of obtaining training data in the training dataset 610 according to embodiments of the present disclosure. For example, the method 800 may be an example implementation of the block 710 as shown in FIG. 7.

At block 810, the model training apparatus 600 may obtain data (referred to as "third data" herein) for training the prediction model 630. In some embodiments, the model training apparatus 600 may, for example, obtain a large amount of user data uncompressed from the host 100 as shown in FIG. 1, or may obtain data before compression (referred to as "fourth data" herein) from the storage manager 120 as shown in FIG. 1. The model training apparatus 600 may partition these uncompressed data blocks into a group of data blocks according to a predetermined size (for example, 8 KB). Subsequently, the storage manager 120 may use a plurality of consecutive data blocks obtained from the group of data blocks, as the third data. In some embodiments, for example, the storage manager 120 may obtain 16 consecutive data blocks (i.e., 128 KB) each time for processing.

Figure 9:
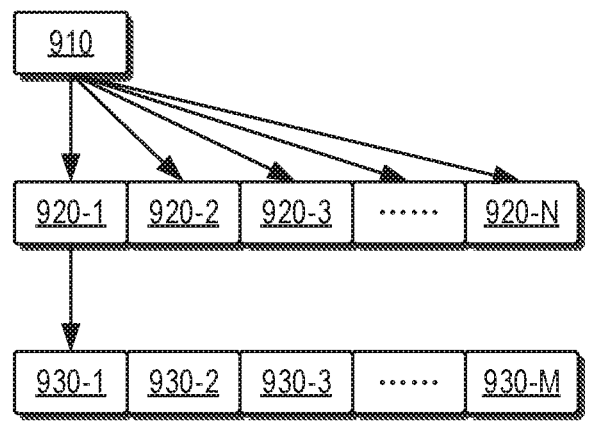
FIG. 9 illustrates a schematic diagram of extracting a feature vector corresponding to training data according to embodiments of the present disclosure.

Alternatively, in some embodiments, the plurality of consecutive data blocks obtained (i.e., the third data) may be represented as a feature vector. Here assumed that the storage manager 120 obtains 16 consecutive data blocks (i.e., 128 KB) each time. In some embodiments, the 128 KB data, for example, may be represented as a feature vector comprised of 16384 features, each feature of which may be a data type of unsigned 64-bit integer, and may be converted from 8 bytes of data in the 128 KB data (or may be itself). FIG. 9 illustrates such example. As shown in FIG. 9, for example, the uncompressed data 910 (i.e., the fourth data) obtained by the model training apparatus 600 may be partitioned into a plurality of data units 920-1, 920-2 . . . 920-N, each data unit 920 of which includes a predetermined number of consecutive data blocks. In addition, each data unit 920 may be represented by M features. Taking the data unit 920-1 as an example, it is represented by a feature vector comprised of M feature vectors 930-1, 930-2 . . . 930-N. Assumed that the data 910 is 100 GB, each data unit 920 is 128 KB and each feature 930 is 8 B, N is 819200 and M is 16384.

Figure 10:
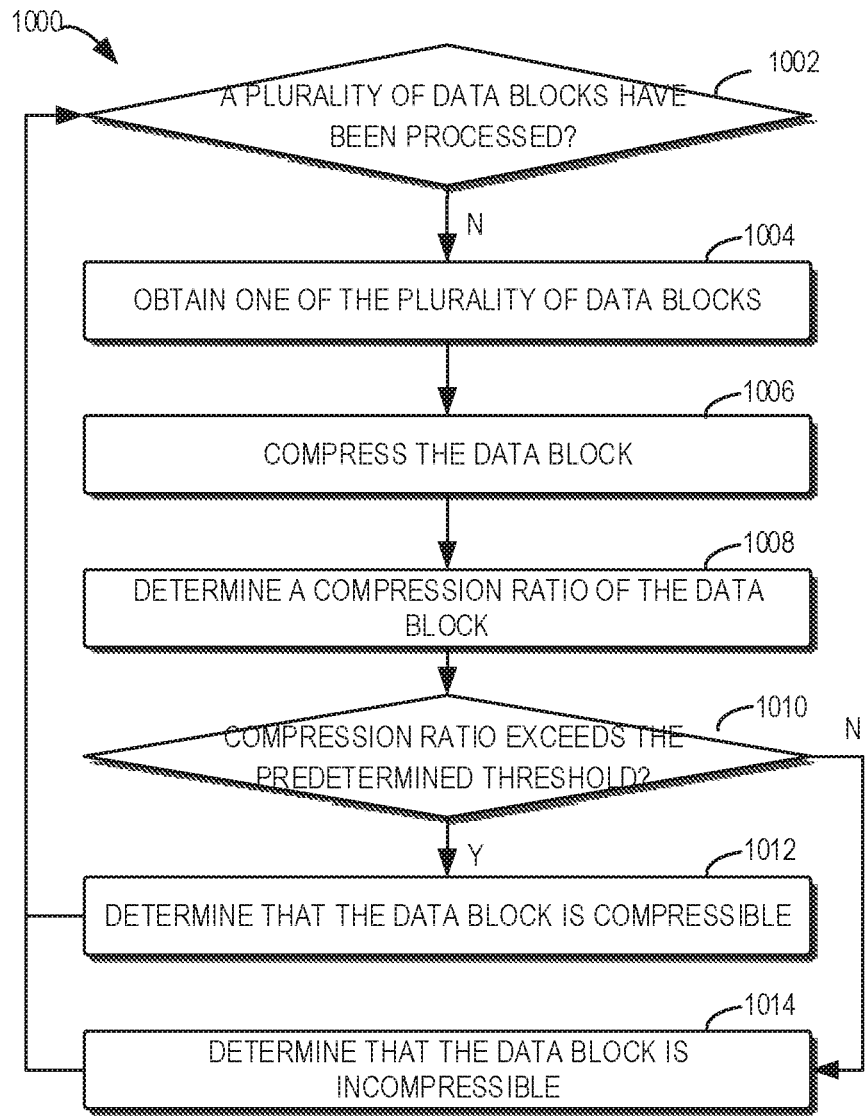
FIG. 10 illustrates a flowchart of an example method of determining whether data are compressible, according to embodiments of the present disclosure.

At block 820, the model training apparatus 600 may determine whether the third data is able to be compressed in a compression ratio exceeding the predetermined threshold. FIG. 10 illustrates a flowchart of an example method 1000 of determining whether data are compressible according to embodiments of the present disclosure. For example, the method 1000 may be an example implementation of the block 820 as shown in FIG. 8. As shown in FIG. 10, at block 1002, the model training apparatus 600 may determine whether a plurality of data blocks included in third data have been processed. If there still remain unprocessed data blocks, at block 1004, the model training apparatus 600 may obtain one of the plurality of data blocks for processing. At block 1006, the model training apparatus 600 may compress the data block. At block 1008, the model training apparatus 600 may determine the compression ratio of the data block. For example, the model training apparatus 600 may determine the compression ratio of the data block by calculating a ratio value of the amount of data before compression to the amount of data after compression. Then, at block 1010, the model training apparatus 600 may determine whether the compression ratio exceeds the predetermined threshold. It so, the model training apparatus 600 may determine that the data block is compressible, at block 1012; otherwise, the model training apparatus 600 may determine the data block incompressible, at block 1014. Thereafter, the method 1000 proceeds to block 1002 until the plurality of data blocks are all processed.

At block 830, the model training apparatus 600 may generate, based on the determined result, a label corresponding to the third data. In some embodiments, the third data with the label may be one of training data included in the training dataset 610. Alternatively, when the third data are represented by a feature vector, the feature vector with the label representing the third data may be one of training data included in the training dataset 610.

In some embodiments, for example, in order to enable the trained prediction model to output the prediction result in the first form, the model training apparatus 600 may label the third data using one of the following three types of labels: a first label that indicates that each of a plurality of consecutive data blocks included in the third data is able to be compressed in a compression ratio exceeding the predetermined threshold; a second label that indicates that each of a plurality of consecutive data blocks included in the third data is unable to be compressed in a compression ratio exceeding the predetermined threshold; or a third label that indicates that a part of a plurality of consecutive data blocks included in the third data is able to be compressed in a compression ratio exceeding the predetermined threshold, and another part is unable to be compressed in a compression ratio exceeding the predetermined threshold.

Figure 11:
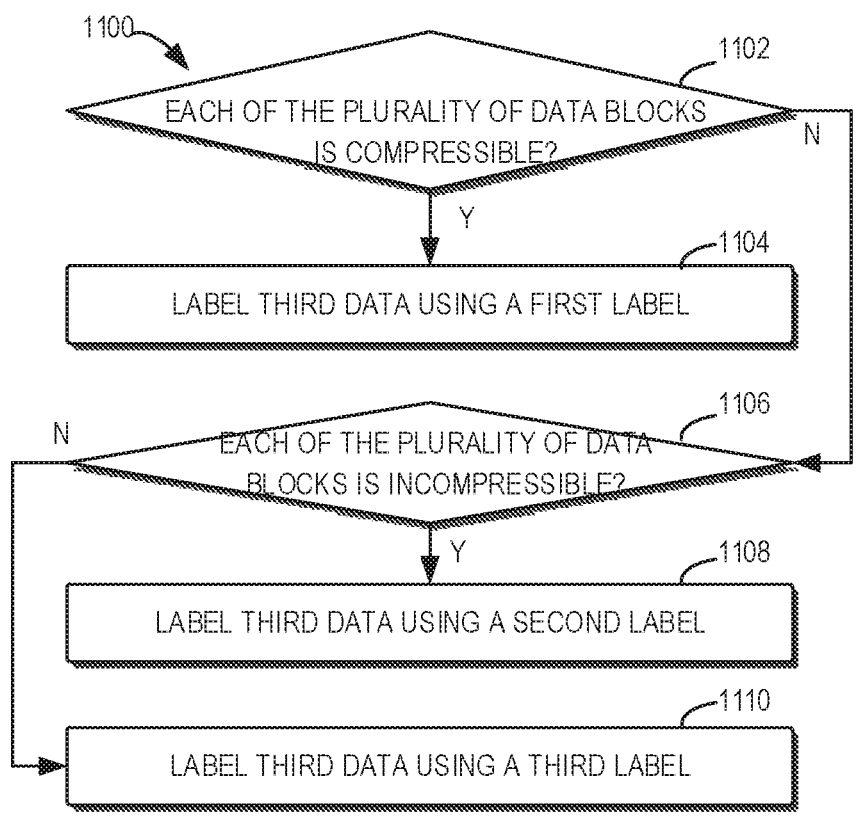
FIG. 11 illustrates a flowchart of an example method of generating a label of training data according to embodiments of the present disclosure.

FIG. 11 illustrates a flowchart of an example method 1100 of generating a label corresponding to the third data, according to embodiments of the present disclosure. For example, the method 1100 may be an example implementation of the block 830 as shown in FIG. 8. As shown in FIG. 11, at block 1102, the model training apparatus 600 may determine whether each of a plurality data blocks is compressible. If so, the model training apparatus 600 may label the third data using the first label as described above, at block 1104. Otherwise, the method 1100 proceeds to block 1106, where the model training apparatus 600 determines whether each of the plurality of data blocks is incompressible. If so, the model training apparatus 600 may label the third data using the second label as described above, at block 1108. Otherwise, at block 1110, the model training apparatus 600 may label the third data using the third label as described above.

Additionally or alternatively, in some embodiments, for example, in order to enable the trained prediction model to output the prediction result in the second form, the model training apparatus 600 may label the third data by using the following as a label: the number of consecutive data blocks capable of being compressed in a compression ratio exceeding the predetermined threshold, or using the number of consecutive data blocks not capable of being compressed in a compression ratio exceeding the predetermined threshold. The above example is provided merely for illustration. It would be appreciated that other labelling manners may be applied to the embodiments of the present disclosure.

In some embodiments, subsequent to obtaining the training dataset, the model training apparatus 600 may further process the obtained training dataset, to improve the quality of the training dataset. For example, the model training apparatus 600 may remove the repeated training data from the training dataset. In addition, the model training apparatus 600 may perform any other processing on the training data in the training dataset, to improve the quality of the training dataset.

Returning to FIG. 7, at block 720, the model training apparatus 600 may use the obtained dataset to train the prediction model.

In some embodiments, the model training apparatus 600 may employ a supervised learning method to train the prediction model. In some embodiments, the model training apparatus 600 may train, using a part of training data in the training dataset, the prediction model, so as to determine various parameters of the prediction model. Moreover, the model training apparatus 600 may use another part of training data in the training dataset as testing data to test the trained prediction model. By comparing the result output by the prediction model with the label in the testing data, an accuracy of the trained prediction model may be determined, and various parameters of the prediction model may be adjusted based on the determined accuracy, until the accuracy of the prediction model meets a predetermined requirement. It would be appreciated that the model training apparatus 600 may utilize any method known or to be developed in the future for training the prediction model, not being confined to those described above.

In the way, the model training apparatus 600 can obtain the prediction model 620 for determining whether the data to be stored is able to be compressed in a compression ratio exceeding the predetermined threshold, for use by the storage manager 120 as shown in FIG. 1.

The example implementations according to the methods of the present disclosure have been described above with reference to FIGS. 1 to 11, and implementations of corresponding apparatuses will be described below.

In some embodiments, there is provided an apparatus for storing data. The apparatus includes: an obtaining model configured to obtain first data to be stored; a determining module configured to determine whether the first data is able to be compressed in a compression ratio exceeding a predetermined threshold; and a storage module configured to store, based on the determined result, the first data into the storage device.

In some embodiments, the obtaining module is further configured to: obtain second data to be stored; partition the second data into a group of data blocks; and obtain, from the group of data blocks, a plurality of consecutive data blocks as the first data.

In some embodiments, the determining module is further configured to: determine, using a trained prediction model, whether the first data is able to be compressed in a compression ratio exceeding the predetermined threshold.

In some embodiments, the first data includes a plurality of data blocks, and the storage module is further configured to: in response to determining that each data block in the plurality of data blocks is able to be compressed in a compression ratio exceeding the predetermined threshold, compress the plurality of data blocks; and store the compressed plurality of data blocks into the storage device.

In some embodiments, the first data includes a plurality of data blocks, and the storage module is further configured to: in response to determining that each data block in the plurality of data blocks is unable to be compressed in a compression ratio exceeding a predetermined threshold, store the plurality of uncompressed data blocks into the storage device.

In some embodiments, the first data includes a plurality of data blocks, and the storage module is further configured to: in response to determining that a part of the plurality of data blocks is able to be compressed in a compression ratio exceeding a predetermined threshold and the other part of the plurality of data blocks is unable to be compressed in a compression ratio exceeding a predetermined threshold, compress, for each data block in the plurality of data blocks, the data block; determine a compression ratio of the data block; in response to the compression ratio exceeding the predetermined threshold, store the compressed data block into the storage device; and in response to the compression ratio of the data block being less than the predetermined threshold, store the uncompressed data block into the storage device.

In some embodiments, there is provided an apparatus for training a prediction model. The apparatus includes: an obtaining model configured to train a training dataset for training a prediction model; and a training model configured to train the prediction model using the training dataset, wherein the prediction model is provided for determining whether data to be stored is able to be compressed in a compression ratio exceeding a predetermined threshold, to store the data to be stored based on a determined result.

In some embodiments, the obtaining module is further configured to: obtain third data for training the prediction model; determine whether the third data may be compressed in a compression ratio exceeding the predetermined threshold; and label, based on the determined result, the third data as training data in a training dataset.

In some embodiments, the third data includes a plurality of data blocks, and the obtaining module is further configured to: compress, for each data block in the plurality of data blocks, the data block; determine a compression ratio of the data block; in response to the compression ratio of the data block exceeding the predetermined threshold, determining that the data block is able to be compressed in a compression ratio exceeding the predetermined threshold; and in response to the compression ratio of the data block being less than the predetermined threshold, determining that the data block is unable to be compressed in a compression ratio exceeding the predetermined threshold.

In some embodiments, the third data includes a plurality of data blocks, and the obtaining module is further configured to: in response to determining that each data block in the plurality of data blocks is able to be compressed in a compression ratio exceeding the predetermined threshold, label the third data using a first label indicating the determined result.

In some embodiments, the third data includes a plurality of data blocks, and the obtaining module is further configured to: in response to determining that each data block in the plurality of data blocks is unable to be compressed in a compression ratio exceeding the predetermined threshold, label the third data using a second label indicating the determined result.

In some embodiments, the third data includes a plurality of data blocks, and the obtaining module is further configured to: in response to determining that a part of the plurality of data blocks is able to be compressed in a compression ratio exceeding the predetermined threshold and the other part of the plurality of data blocks is unable to be compressed in a compression ratio exceeding the predetermined threshold, label the third data using a third label indicating the determined result.

Figure 12:
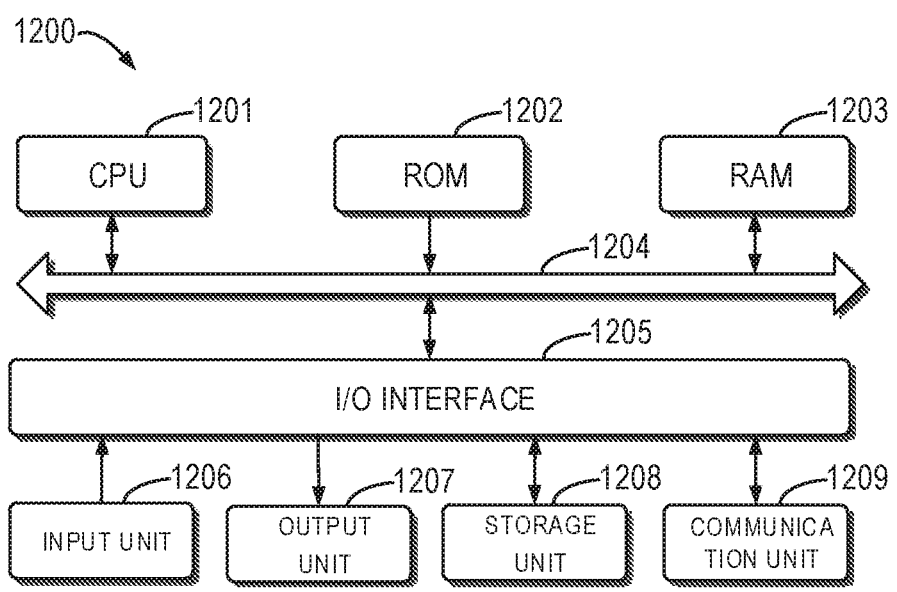
FIG. 12 illustrates a schematic block diagram of an example device that may be used to implement embodiments of the present disclosure.

FIG. 12 illustrates a block diagram of an example device 1200 that can be used to implement the embodiments of the present disclosure. For example, the storage manger 120 as shown in FIG. 1 and/or the model training apparatus 620 can be implemented by the device 1200. As shown in FIG. 12, the device 1200 includes a central processing unit (CPU) 1201 which performs various appropriate actions and processing, based on a computer program instruction stored in a read-only memory (ROM) 1202 or a computer program instruction loaded from a storage unit 1208 to a random access memory (RAM) 1203. The RAM 1203 stores therein various programs and data required for operations of the device 1200. The CPU 1201, the ROM 1202 and the RAM 1203 are connected via a bus 1204 with one another. An input/output (I/O) interface 1205 is also connected to the bus 1204.

The following components in the device 1200 are connected to the I/O interface 1205: an input unit 1206 such as a keyboard, a mouse and the like; an output unit 1207 including various kinds of displays and a loudspeaker, etc.; a storage unit 1208 including a magnetic disk, an optical disk, and etc.; a communication unit 1209 including a network card, a modem, and a wireless communication transceiver, etc. The communication unit 1209 allows the device 1200 to exchange information/data with other devices through a computer network such as the Internet and/or various kinds of telecommunications networks.

Various processes and processing described above, e.g., the methods 200, 300, 400, 500, 700, 800, 1000 and/or 1100, may be executed by the processing unit 1201. For example, in some embodiments, the methods 200, 300, 400, 500, 700, 800, 1000 and/or 1100 may be implemented as a computer software program that is tangibly included in a machine readable medium, e.g., the storage unit 1208. In some embodiments, part or all of the computer programs may be loaded and/or mounted onto the device 1200 via ROM 1202 and/or communication unit 1209. When the computer program is loaded to the RAM 1203 and executed by the CPU 1201, one or more steps of the methods 200, 300, 400, 500, 700, 800, 1000 and/or 1100 as described above may be executed.

The present disclosure may be a method, an apparatus, a system, and/or a computer program product. The computer program product may include a computer readable storage medium having computer readable program instructions thereon for causing a processor to carry out aspects of the present disclosure.

The computer readable storage medium can be a tangible apparatus that can retain and store instructions for use by an instruction execution apparatus. The computer readable storage medium may be, for example, but is not limited to, an electronic storage apparatus, a magnetic storage apparatus, an optical storage apparatus, an electromagnetic storage apparatus, a semiconductor storage apparatus, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals sent through a wire.

Computer readable program instructions described herein can be downloaded to respective computing/processing devices from a computer readable storage medium or to an external computer or external storage device via a network, for example, the Internet, a local area network, a wide area network and/or a wireless network. The network may include copper transmission cables, optical transmission fibers, wireless transmission, routers, firewalls, switches, gateway computers and/or edge servers. A network adapter card or network interface in each computing/processing apparatus receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions may be provided to a processor unit of a general purpose computer, special purpose computer, or other programmable data processing device to produce a machine, such that the instructions, when executed via the processing unit of the computer or other programmable data processing apparatus, create means (e.g., specialized circuitry) for implementing the functions/acts specified in the flowchart and/or block diagram block or blocks. These computer readable program instructions may also be stored in a computer readable storage medium that can direct a computer, a programmable data processing device, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions may also be loaded onto a computer, other programmable data processing apparatus, or other devices to cause a series of operational steps to be performed on the computer, other programmable devices or other apparatus to produce a computer implemented process, such that the instructions which are executed on the computer, other programmable apparatus, or other devices implement the functions/acts specified in the flowchart and/or block diagram block or blocks.

The flowchart and block diagrams illustrate the architecture, functionalities, and operations of possible implementations of systems, methods and computer program products according to various embodiments of the present disclosure. In this regard, each block in the flowchart or block diagrams may represent a module, snippet, or portion of code, which includes one or more executable instructions for implementing the specified logical function(s). In some alternative implementations, the functions noted in the block may occur out of the order noted in the figures. For example, two blocks in succession may, in fact, be executed substantially concurrently, or the blocks may sometimes be executed in the reversed order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A method of storing data, comprising:
   obtaining first data to be stored;
   determining whether the first data is able to be compressed in a compression ratio exceeding a predetermined threshold; and
   storing, based on the determined result, the first data into a storage device, wherein the first data comprise a plurality of data blocks, and wherein storing the first data comprises:
   in response to determining that a part of the plurality of data blocks is able to be compressed in a compression ratio exceeding the predetermined threshold and another part of the plurality of data blocks is unable to be compressed in a compression ratio exceeding the predetermined threshold, for each of the plurality of data blocks,
   compressing the data block to create a compressed data block;
   determining a compression ratio of the compressed data block;
   in response to the compression ratio of the compressed data block exceeding the predetermined threshold, storing the compressed data block into the storage device; and
   in response to the compression ratio of the compressed data block being below the predetermined threshold, storing the data block into the storage device.

2. The method according to claim 1, wherein obtaining the first data comprises:

obtaining second data to be stored;
partitioning the second data into a group of data blocks; and
obtaining, from the group of data blocks, a plurality of consecutive data blocks as the first data.

3. The method according to claim 1, wherein determining whether the first data is able to be compressed in a compression ratio exceeding the predetermined threshold comprises:
determining, using a trained prediction model, whether the first data is able to be compressed in a compression ratio exceeding the predetermined threshold.

4. An apparatus for storing data, comprising:
at least one processing unit;
at least one memory coupled to the at least one processing unit and storing instructions executed by the at least one processing unit, the instructions, when executed by the at least one processing unit, causing the apparatus to execute acts of:
obtaining first data to be stored;
determining whether the first data is able to be compressed in a compression ratio exceeding a predetermined threshold; and
storing, based on the determined result, the first data into a storage device,
wherein the first data comprise a plurality of data blocks, and wherein storing the first data comprises:
in response to determining that a part of the plurality of data blocks is able to be compressed in a compression ratio exceeding the predetermined threshold and another part of the plurality of data blocks is unable to be compressed in a compression ratio exceeding the predetermined threshold, for each of the plurality of data blocks,
compressing the data block to create a compressed data block;
determining a compression ratio of the compressed data block;
in response to the compression ratio of the compressed data block exceeding the predetermined threshold, storing the compressed data block into the storage device; and
in response to the compression ratio of the compressed data block being below the predetermined threshold, storing the data block into the storage device.

5. The apparatus according to claim 4, wherein obtaining the first data comprises:
obtaining second data to be stored;
partitioning the second data into a group of data blocks; and
obtaining, from the group of data blocks, a plurality of consecutive data blocks as the first data.

6. The apparatus according to claim 4, wherein determining whether the first data is able to be compressed in a compression ratio exceeding the predetermined threshold comprises:
determining, using a trained prediction model, whether the first data is able to be compressed in a compression ratio exceeding the predetermined threshold.

7. A computer program product having a non-transitory computer readable medium which stores a set of instructions to store data; the set of instructions, when carried out by computerized circuitry, causing the computerized circuitry to perform a method of:
obtaining first data to be stored;
determining whether the first data is able to be compressed in a compression ratio exceeding a predetermined threshold; and
storing, based on the determined result, the first data into a storage device,
wherein the first data comprise a plurality of data blocks, and wherein storing the first data comprises:
in response to determining that a part of the plurality of data blocks is able to be compressed in a compression ratio exceeding the predetermined threshold and another part of the plurality of data blocks is unable to be compressed in a compression ratio exceeding the predetermined threshold, for each of the plurality of data blocks,
compressing the data block to create a compressed data block;
determining a compression ratio of the compressed data block;
in response to the compression ratio of the compressed data block exceeding the predetermined threshold, storing the compressed data block into the storage device; and
in response to the compression ratio of the compressed data block being below the predetermined threshold, storing the data block into the storage device.

8. The computer program product according to claim 7, wherein obtaining the first data comprises:
obtaining second data to be stored;
partitioning the second data into a group of data blocks; and
obtaining, from the group of data blocks, a plurality of consecutive data blocks as the first data.

9. The computer program product according to claim 7, wherein determining whether the first data is able to be compressed in a compression ratio exceeding the predetermined threshold comprises:
determining, using a trained prediction model, whether the first data is able to be compressed in a compression ratio exceeding the predetermined threshold.

* * * * *